(12) United States Patent
Amir

(10) Patent No.: US 11,686,752 B2
(45) Date of Patent: *Jun. 27, 2023

(54) MONITORING CIRCUITRY

(71) Applicant: HP INDIGO B.V., Amstelveen (NL)

(72) Inventor: Gideon Amir, Ness Ziona (IL)

(73) Assignee: HP INDIGO B.V., Amstelveen (NL)

( * ) Notice: Subject to any disclaimer, the term of this patent is extended or adjusted under 35 U.S.C. 154(b) by 147 days.

This patent is subject to a terminal disclaimer.

(21) Appl. No.: 17/238,674

(22) Filed: Apr. 23, 2021

(65) Prior Publication Data

US 2021/0263087 A1 Aug. 26, 2021

Related U.S. Application Data

(63) Continuation of application No. 16/072,969, filed as application No. PCT/EP2016/059702 on Apr. 29, 2016, now Pat. No. 11,016,131.

(51) Int. Cl.
  *G01R 27/20* (2006.01)
  *A61J 1/03* (2023.01)
  (Continued)

(52) U.S. Cl.
  CPC ............ *G01R 27/205* (2013.01); *A61J 1/035* (2013.01); *A61J 7/0436* (2015.05); *G01R 31/50* (2020.01);
  (Continued)

(58) Field of Classification Search
  CPC ...... G01R 31/54; G01R 31/52; G01R 27/205; G01R 31/50; A61J 1/035; A61J 7/0436; A61J 7/0481; G16Z 99/00; G06F 19/00
  USPC ........ 324/510–515, 500, 323–368, 600, 637, 324/200, 263, 522, 713, 76.11, 324/76.69–76.77
  See application file for complete search history.

(56) References Cited

U.S. PATENT DOCUMENTS

| 5,412,372 A | 5/1995 | Parkhurst et al. |
| 7,113,101 B2 | 9/2006 | Petersen |

(Continued)

FOREIGN PATENT DOCUMENTS

| CN | 101281218 A | 10/2008 |
| CN | 101363881 A | 2/2009 |

(Continued)

OTHER PUBLICATIONS

Cerepak Smart Adherence Packaging, 2016 WestRock Company, 1 page.

*Primary Examiner* — Lee E Rodak
*Assistant Examiner* — Trung Q Nguyen

(57) ABSTRACT

In an example, monitoring circuitry includes a first and a second coupling to electrically connect the monitoring circuitry to a monitored circuit having a resistance. The resistance of the monitored circuit may be indicative of a status, and the monitored circuit may be connected in series between the first and second coupling. The first coupling comprises a plurality of galvanically separated connection elements which are to form an electrical connection with a common connection element of the monitored circuit. The monitoring circuitry further comprises a monitoring apparatus to determine the resistance of the monitored circuit via the first coupling and the second coupling. The monitoring apparatus is to acquire a plurality of electrical values and to use the plurality of electrical values to determine a value of the resistance of the monitored circuit.

14 Claims, 4 Drawing Sheets

(51) Int. Cl.
    *A61J 7/04*      (2006.01)
    *G01R 31/50*     (2020.01)
    *G01R 31/52*     (2020.01)
    *G01R 31/54*     (2020.01)
    *G16Z 99/00*     (2019.01)

(52) U.S. Cl.
    CPC ............ *G01R 31/52* (2020.01); *G01R 31/54* (2020.01); *A61J 7/0481* (2013.01); *G16Z 99/00* (2019.02)

(56) References Cited

U.S. PATENT DOCUMENTS

| | | |
|---|---|---|
| 8,960,440 B1 | 2/2015 | Kronberg |
| 2010/0089789 A1 | 4/2010 | Rosenbaum et al. |
| 2011/0100862 A1 | 5/2011 | Turkington et al. |
| 2013/0285681 A1 | 10/2013 | Wilson et al. |
| 2014/0052467 A1 | 2/2014 | Maijala et al. |
| 2015/0015281 A1 | 1/2015 | Bogner |
| 2015/0228178 A1 | 8/2015 | Harris |
| 2015/0249059 A1* | 9/2015 | Maijala ................ H01L 23/645 257/664 |
| 2016/0103085 A1* | 4/2016 | Mehregany .......... B65D 75/327 361/679.01 |
| 2016/0258820 A1* | 9/2016 | Pollock .................... G01K 7/22 |

FOREIGN PATENT DOCUMENTS

| | | |
|---|---|---|
| CN | 101907657 A | 12/2010 |
| WO | WO-2004028438 | 4/2004 |
| WO | WO-2010080770 | 7/2010 |

\* cited by examiner

MONITORING CIRCUITRY

CROSS REFERENCE TO RELATED APPLICATIONS

The present application is a continuation of U.S. patent application Ser. No. 16/072,969, filed on Jul. 26, 2018, which is a U.S. National Stage under 35 U.S.C. § 371 of International Patent Application No. PCT/EP2016/059702, filed Apr. 29, 2016, the disclosures of which are hereby incorporated herein by reference.

BACKGROUND

Monitoring circuitry may be used to monitor the status of a monitored circuit. For example, monitoring circuitry may be used in conjunction with 'smart packages'. Smart packages are packages which are capable of performing functions in addition to containing products. For example they may comprise security functions, or provide verification of a product's source or the like. In some examples, smart packages may be monitored to determine if the interior of a storage volume has been accessed.

BRIEF DESCRIPTION OF DRAWINGS

Examples will now be described, by way of non-limiting example, with reference to the accompanying drawings, in which.

DETAILED DESCRIPTION

Figure 1:
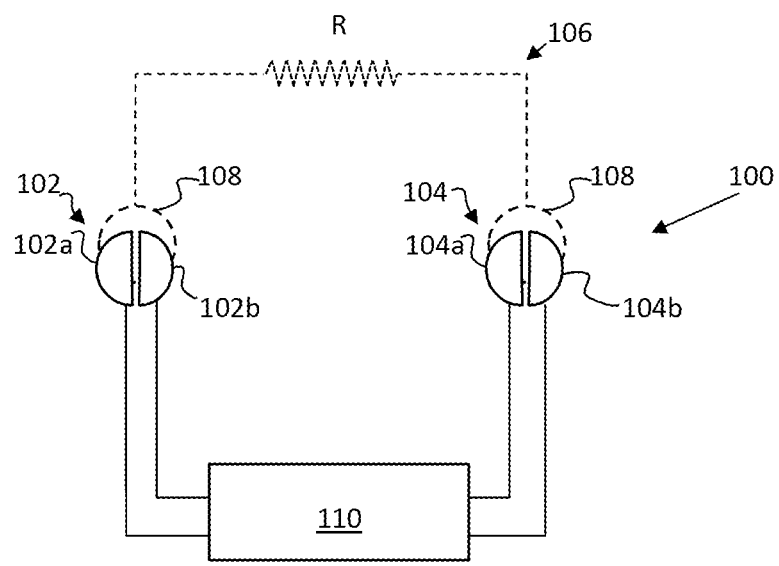
FIG. 1 is a simplified schematic diagram of example monitoring circuitry.

In the drawings, where it aids clarity, like parts are labelled with like numbers.

FIG. 1 is a schematic diagram of example monitoring circuitry 100 comprising a first coupling 102 and a second coupling 104, the first and second couplings 102, 104 being to electrically connect the monitoring circuitry 100 to a monitored circuit 106 (shown in dotted line) having a resistance R such that there is a substantially continuous electrical connection formed therebetween. The resistance R of the monitored circuit 106 is indicative of a status, and the monitored circuit 106 is to be connected in series between the first and second couplings 102, 104.

For example, the monitored circuit 106 may comprise a conductive track provided (for example, printed using conductive ink) on a packaging. The track may be broken in accessing the interior of the packaging. In one particular example, the packaging may comprise a blister pack for dispensing medication and a plurality of tracks may be provided, one track associated with each 'blister'. When the blister is broken to dispense a pill or the like, the track (which may be printed on a frangible substrate such as paper or the like) may be broken and thus the resistance associated with the circuit increases (in some examples, becoming very high). In some examples, the monitored circuit 106 may comprises a plurality of such tracks which are interlinked to form the monitored circuit 106 and breaking one track may change the resistance of the monitored circuit 106. In other examples, the resistance of each track of the plurality of tracks may be monitored. Other package types may also comprise monitored storage volumes, for example, a track may run over a closure of a box or bag type container and be broken when the closure is opened.

At least one of the first 102 and second 104 coupling (and in the example of the FIG. 1, both) comprises at least two connection elements 102a, 102b, 104a, 104b, wherein the connection elements 102a, 102b, 104a, 104b of a coupling 102, 104 are to form an electrical connection with a common connection element 108 of the monitored circuit 106. The connection elements 102a, 102b, 104a, 104b of a coupling 102, 104 are galvanically separated from one another, in the sense that there is no continuous electrical circuit formed between the connection elements 102a, 102b, 104a, 104b in the monitoring circuitry 100. However, as will be appreciated from the description that follows, the connection elements 102a, 102b, 104a, 104b may be electrically connected in use, for example via the common connection element 108 of the monitored circuit 106.

The monitoring circuitry 100 also comprises monitoring apparatus 110 to determine the resistance of the monitored circuit 106 via the couplings 102, 104. The monitoring apparatus 110 is to acquire a plurality of electrical values and to use the plurality of electrical values to determine a value of the resistance R of the monitored circuit 106.

The resistance of a circuit which includes both the monitored circuit 106 and the monitoring circuitry 100 in practice includes not just the resistance R but also the resistance of an electrical connection between the couplings 102, 104 and their respective common connection element 108. This 'coupling resistance' may vary based on how much of the surface area of electrical connectors are in contact, or how corroded or dirty the contacts are, or the like. Determining or otherwise accounting for the coupling resistance may allow the resistance R of the monitored circuit to be determined more accurately than, for example, if the coupling resistance is assumed to be zero or of a constant value.

In some examples herein, the monitoring apparatus 110 acquires a plurality of electrical values and uses the plurality of electrical values to determine a value of the resistance R of the monitored circuit 106 which is at least substantially independent of the resistance of the electrical connection between the monitored circuit 106 and the monitoring circuitry 100. This may increase the accuracy with which the resistance of a partially or wholly broken track may be determined. In some examples (see for example, FIG. 7 below), where a plurality of such tracks which are interlinked, this may allow a smaller difference in resistance to be determined, which may in turn increase the number or number of options for interlinking the tracks. Even in examples where each track is monitored individually, the resistance of a track may be high when the track is complete (i.e. unbroken) in order to reduce energy consumption (i.e. to keep current flow low). In such examples, the resistive difference between a whole and a broken or partially broken track may be small and therefore increasing the accuracy with which the resistance may be determined may assist in discrimination between a whole and broken (or partially broken) track.

In some examples, the monitoring apparatus 110 may determine a plurality of resistance values associated with each of a plurality of connections between the monitoring circuitry 100 and the monitored circuit 106 (for example, a plurality of 'coupling resistances', associated with different connection elements 102a, 102b, 104a, 104b). In some examples, the monitoring apparatus 110 may apply a current to the monitored circuit via a first connection and determine a voltage across the monitored circuit 106 via a second connection. The monitoring apparatus 110 may for example comprise processing circuitry such as at least one processor or the like. In some examples, the monitoring apparatus 110 may comprise at least one of an ammeter to measure current and voltmeter to measure voltage.

In the example of the Figures, the common connection element 108 comprises a pad covering a spatial region. For example, the common connection element 108 may comprise a region of a substrate printed with conductive ink. In the example of FIG. 1, each connection element 102a, 102b, 104a, 104b is also a contact pad and together they have an area which is substantially similar to the surface area of the connection element 108. However, this need not be the case. For example, although the couplings 102, 104 and common connection elements 108 are shown as circular, this is purely illustrative and they could have any shape or form. Further, although the sizes of the connection elements 102a, 102b, 104a, 104b are shown to be similar, they could differ is size, shape or form, and in other examples may not cumulatively provide an area which is similar in size or form to a common connection element 108.

While the common connection elements 108 are shown herein to be a continuous pad, this need not be the case. In some examples, the common connection element 108 may comprise a plurality of separate connection points (for example, a point corresponding to each connection element 102a, 102b, 104a, 104b of a coupling 102, 104, and the connection points may be galvanically connected at a point in the monitored circuit 106 other than at the coupling between the monitored circuit 106 and the monitoring circuitry 100 such that a single current path is provided across the measured resistance R of the circuit whichever connection point is coupled to a connection element 102a, 102b, 104a, 104b. In such an example, the connection points provide a common connection to the measured resistance, and the common connection element provides a current path between the connection elements 102a, 102b, 104a, 104b of a coupling 102, 104. A common connection element 108 may have any form which allows each connection element 102a, 102b, 104a, 104b to form an electrical connection with the resistance R, and which may provide a current path between the connection elements 102a, 102b, 104a, 104b of a coupling 102, 104 when the monitored circuit 106 is coupled to the monitoring circuitry 100.

In the example of FIG. 1, when in use, the galvanically separated connection elements 102a, 102b, 104a, 104b of the monitoring circuitry 100 are intended to be in at least partial physical contact with a common connection element 108. Even in the case that the connection elements 102a, 102b; 104a, 104b of the monitoring circuitry 100 are in good contact with respective common connection elements 108, there may be a coupling resistance. In examples where the monitoring circuitry 100 is to be, for example, used in conjunction with a packaging, it may be clipped or secured thereto, but there may be at least some possibility of movement, or at least one of the connection elements 102a, 102b, 104a, 104b, 108 may be corroded, dirty or misshapen or the like. Therefore, while in some cases it may be that the resistance between the connection elements 102a, 102b, 104a, 104b of the monitoring circuitry 100 and the common connection element 108 is low, it may not be the case that this can be assumed to be at least approximately zero.

Figure 2:
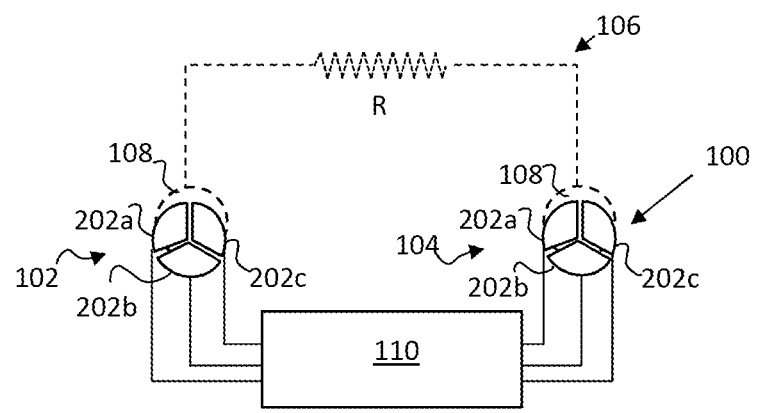
FIGS. 2-4 are simplified schematic diagrams of examples of monitoring circuitry.

FIG. 2 shows an example of a monitoring circuitry 200 in which the first and second couplings 102, 104 each comprise a first 202a, second 202b and third 202c galvanically separated connection element.

The connection elements 202a-c are to connect with a common connection element 108 of the monitored circuit 106.

Each connection element 202a-c has its own coupling resistance to the common connection element 108. In this example, the coupling resistance between the first connection element 202a and the common connection element 108 is R1, the coupling resistance between the second connection element 202b and the common connection element 108 is R2 and the coupling resistance between the third connection element 202c and the common connection element 108 is R3.

In this example, the monitoring apparatus 110 may determine these coupling resistances. In some examples, the monitoring apparatus 110 may comprise at least one energy source (for example, a battery or the like) and may connect the energy source to cause current to flow through each of three circuits. The resistance of each of these circuits may be determined, for example using measurements of the voltage and current. In a first circuit, the first and second connection elements 202a, 202b are connected via the common connection element 108. Assuming the resistance within the common connection element 108 is minimal, this provides a resistance for that circuit (i.e. a resistance between the first and second connection elements via the common connection element) of:

$$R_{12}=R1+R2$$

A similar circuit may be formed between the second and third connection elements 202b, 202c to find the resistance between a second and third connection element via the common connection element 108:

$$R_{23}=R2+R3$$

A similar circuit may be formed between the first and third connection elements 202a, 202c to find the resistance between a first and third connection element via the common connection element 108:

$$R_{13}=R1+R3$$

From $R_{12}$, $R_{23}$, $R_{13}$, R1, R2 and R3 can be calculated:

$$R3=(R_{23}+R_{13}-R_{12})/2$$

$$R2=R_{23}-R3$$

$$R1=R_{13}-R3$$

As the coupling resistance may be determined for any or all connections to the monitored circuit 106, this allows the resistance R of the monitored circuit 106 to be determined with greater accuracy, as any discrepancy between a nominal coupling resistance, which may for example be zero, and the actual coupling resistance is quantified. In other words, the monitoring circuitry 100 may be calibrated to account for the resistance in this example of the electrical connection between the monitoring circuitry 100 and the monitored circuit 106. R may then be determine via measurement made using any or all of the connection elements 202a-c, 204a-c.

It will be noted that determining the coupling resistance for one coupling 102, 104 improves the accuracy and therefore is some examples the resistance of one coupling 102, 104 may be determined. This may for example be the case if one of the couplings 102, 104 can be assumed to be lower resistance, for example due to the physical structure thereof. However, in other examples, the coupling resistance for both couplings 102, 104 may be determined.

Figure 3:
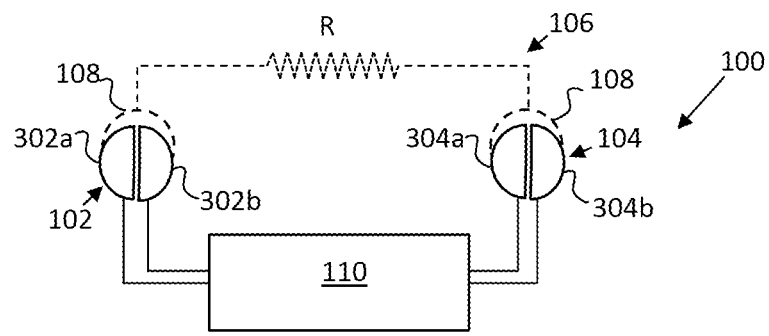

FIG. 3 shows another example in which each of the first and second coupling 102, 104 comprises two galvanically separated connection elements 302a, 302b, 304a, 304b.

The connection elements 302a, 302b, 304a, 304b, of each coupling 102, 104 are to connect with a common connection element 108 of the monitored circuit 106.

In this example, the monitoring apparatus 110 is to acquire (for example by measuring current and voltage values) electrical values comprising:

a first resistance between the first 302a and second 302b connection elements of the first coupling 102 via the common connection element 108 to which they are connected ($R_{11\text{-}21}$)

a second resistance between the first 304a and second 304b connection elements of the second coupling 104 via the common connection element 108 to which they are connected ($R_{12\text{-}22}$);

a third resistance between the first connection element 302a of the first coupling 102 and the first connection element 304a of the second coupling 104 via the monitored circuit 106 ($R_{11\text{-}12}$);

a fourth resistance between the second connection element 302b of the first coupling 102 and second connection element 304b of the second coupling 104 via the monitored circuit 106 ($R_{21\text{-}22}$);

a fifth resistance between the first connection element 302a of the first coupling 102 and the second connection element 304b of the second coupling via the monitored circuit 106 ($R_{11\text{-}22}$); and a sixth resistance between the second connection element 302b of the first coupling 102 and the first connection element 304a of the second coupling via the monitored circuit 106 ($R_{21\text{-}12}$).

Assuming that the first 302a and second 302b connection elements of the first coupling 102 have coupling resistances of R1 and R2 respectively in their connection to the monitored circuit 106, and the first 304a and second 304b connection elements of the second coupling 104 have coupling resistances of R3 and R4 respectively in their connection to the monitored circuit 106 (and the resistance within each common connection element 108 is negligibly small):

$$R_{11\text{-}21}=R1+R2$$

$$R_{12\text{-}22}=R3+R4$$

$$R_{11\text{-}12}=R1+R3+R$$

$$R_{21\text{-}22}=R2+R4+R$$

$$R_{11\text{-}22}=R1+R4+R$$

$$R_{21\text{-}12}=R2+R3+R$$

These relationships allow the resistance R of the monitored circuit 106 to be calculated as:

$$R=((R_{11\text{-}12}+R_{11\text{-}22}+R_{21\text{-}12}+R_{21\text{-}22})/2-(R_{11\text{-}21}+R_{12\text{-}22}))/2$$

This therefore discounts or negates the effects of any of the connection resistances R1-R4 on the determination of R.

Figure 4:
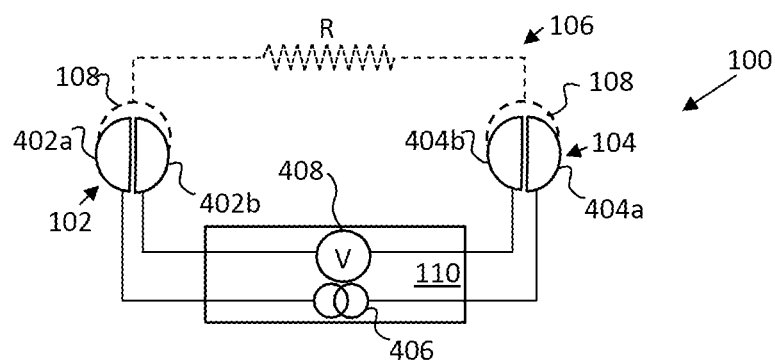

FIG. 4 shows an example wherein each of the first and second couplings 102, 104 comprises two galvanically separated connection elements 402a, 402b, 404a, 404b. The monitoring circuitry 100 comprises a current source 406 to pass a current having a predetermined current value though a monitored circuit 106 via a first connection element 402a of the first coupling 102 and a first connection element 404a of the second coupling 104.

The monitoring apparatus 110 further comprises apparatus to determine a voltage, for example a voltmeter 408. The monitoring apparatus 110 acquires electrical values comprising the predetermined current value and a voltage (in this example, measured by the voltmeter 408) across a second connection element 402b of the first coupling 102 and a second connection element 404b of the second coupling 104. It may be noted that in some examples, the current value may not be measured directly and instead a value supplied to the current source may be used.

The resistance R is determined as the measured voltage divided by the current of the current source 406. This will provide a measurement of R on which the coupling resistances have a small (in some example, minimal or negligible) effect. Voltmeters have a high resistance (for example in the Mega-ohms or sometime Giga-Ohms range), which may be assumed to be higher than the coupling resistances. Since the voltage measurement is made while consuming very low current (because the resistance of the voltmeter 408 is high), the proportion of the voltage measurement attributable to the connection resistance between the second connection element 402b of the first coupling 102 and the common connection element 108, and between the second connection element 404b of the second coupling 104 and the common connection element 108 is minimal, and the effect of the coupling resistance on the determined value of R is small.

Figure 5:
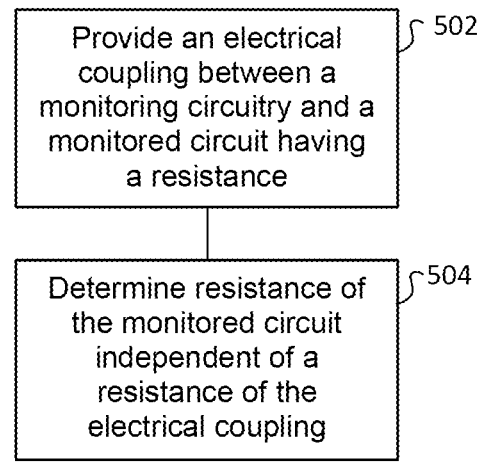
FIG. 5 is a flowchart of an example of a method of determining the resistance of a monitored circuit.

FIG. 5 is a flowchart of a method comprising, in block 502, providing an electrical connection between a monitoring circuitry and a monitored circuit having a resistance. In block 504, the resistance of the monitored circuit is determined; wherein determining the resistance comprises determining a resistance value which is at least substantially independent of a resistance of the electrical connection.

In some examples, block 504 may comprise determining at least one electrical connection resistance (i.e. a coupling resistance) and offsetting the effects of the resistance from the determined resistance of the monitored circuit. For example, this may be determined as described in relation to FIG. 2 or FIG. 3.

In some examples, block 504 may comprise reducing the effect of at least one electrical connection resistance by supplying a current and measuring a resistance over different connection elements, for example as described in relation to FIG. 4.

Figure 6:
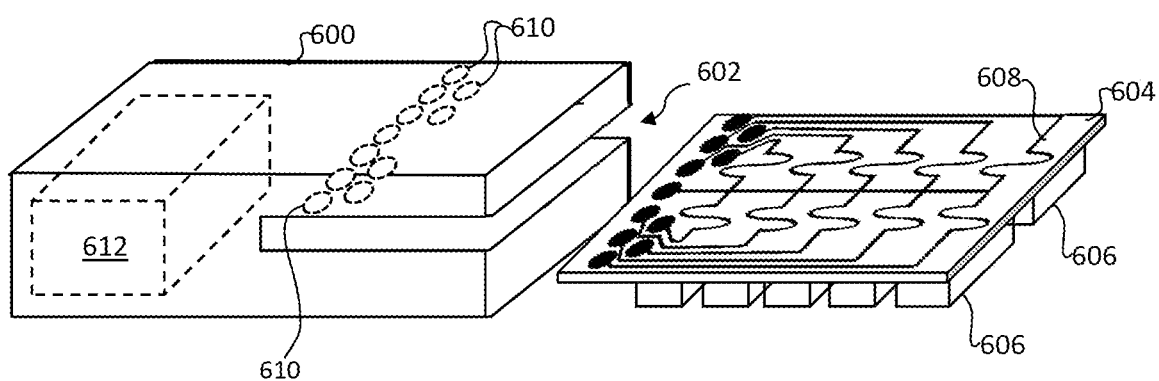
FIG. 6 is a simplified schematic diagram of example blister pack monitor.

FIG. 6 shows a blister pack monitor 600 comprising a securing element 602 (in this example, a slot providing a substantially interference fit) to secure a blister pack 604 comprising at least one (in this example, ten) storage volumes 606 and at least one (in this example, ten) monitored tracks 608 which are interrupted to provide access to an interior of the storage volume 606. For example, each storage volume 606 may initially house a pill or tablet, and be closed with a frangible, for example, paper or paper-like, covering. The covering of each storage volume 606 may bear part of a conductive monitored track 608 (which in some examples may be printed thereon using conductive ink), which in the example of the figure has a serpentine configuration to increase the likelihood that it is broken when the pill is accessed, although this need not be the case in all examples. In other examples, the securing element 602 may comprise a clamp or a clip or the like to secure the blister pack 604 with a gripping force, which may in some examples be applied and removed. In other examples, the securing element 602 may for example comprise an adhesive, or a coupling fabric such as part of a 'hook and loop' fabric coupling, with the corresponding part being provided on a blister pack 604. In other examples, the blister pack 604 may comprises an element, such as a ridge or a hole, which interacts with or receives at least part of the securing element 602. Other examples of securing elements 602 may be provided.

The blister pack monitor 600 further comprises in this example eleven couplings 610 which provide an electrical connection with a monitored track 608 of a secured blister pack 604. It will be noted that a first coupling 610 is associated with each track 608 (i.e. ten such couplings are provided), whereas a second coupling 610 is shared and may be used to interrogate each of the tracks 608. Although not shown to avoid over complicating the figure, each of coupling 610 comprises a plurality of galvanically separated connection elements as discussed above with reference to FIGS. 1-4.

The blister pack monitor 600 further comprises electronic monitoring apparatus 612 to determine a status of the monitored tracks 608, wherein the electronic monitoring apparatus 612 is to counteract the effect of a resistance of the electrical connection between the monitor 600 and the blister pack 604.

Some but not all of the storage volumes 606, tracks 608 and couplings 610 are labelled to avoid overcomplicating the Figure.

The electronic monitoring apparatus 612 may determine the status of each of a plurality of monitored tracks 608 (i.e. whether the track is complete or interrupted), each of the tracks 608 being associated with a different storage volume 606. An interrupted track may be indicative of a pill having been dispensed. For example, the electronic monitoring apparatus 612 may carry out the method of FIG. 5, or may operate according to the principles set out in relation to any of FIGS. 1 to 4. The methods may be carried out in relation to each track 608 in turn.

In examples, the blister pack monitor 600 may comprise at least one of processing circuitry, a voltmeter and an ammeter, and may comprise other electronic circuitry. The blister pack monitor 600 may comprise additional components, for example a communication port or facility to allow the status of a track 608 to be communicated, for example by wireless or wired communication. The blister pack monitor 600 may also comprise alert apparatus, for example, an alarm (such as sound or light) to alert a patient that a pill should be dispensed, and breaking a track 608 may silence or terminate the alarm.

In the example of FIG. 6, the blister pack 604 comprises 10 tracks 608 (in effect, 10 monitored circuits) which are monitored using 11 couplings 610. In some examples, a blister pack monitor 600 may comprise a plurality of couplings 610 to provide an electrical connection to each of a plurality of monitored tracks 608, and in which the number of couplings 610 is less than the number of monitored tracks 608.

Figure 7:
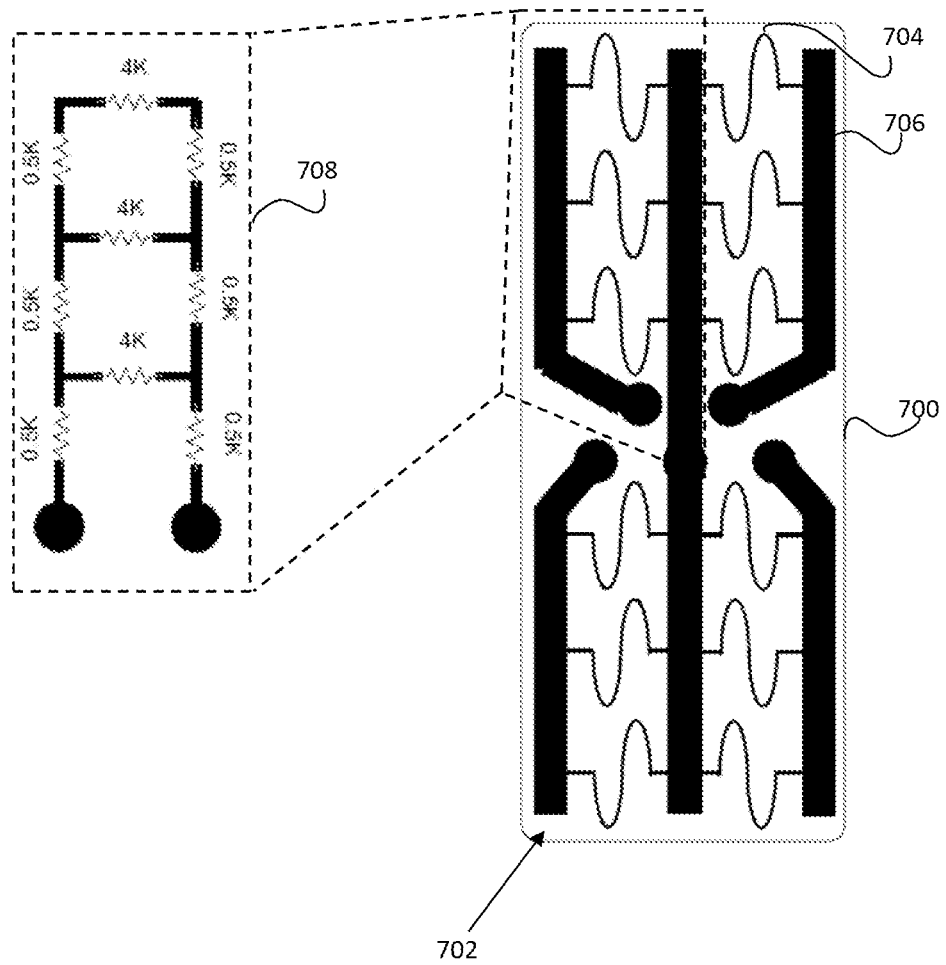
FIG. 7 is a simplified schematic diagram of an example blister pack.

In such an example, as is illustrated in relation to FIG. 7, a blister pack 700 may be provided with tracks which are interconnected to form a network 702. For example, the tracks have a relatively high resistance portion 704 associated with a storage volume and a relatively low resistance portion 706 associated with a joining section. For example, the tracks may be printed with conductive inks (such as ink comprising of carbon-nanotubes, in which narrower traces will exhibit higher resistance. Different resistance levels may for example be achieved by either/both of printing with different widths and different thickness of the layer (for example by printing multiple layers of a conductive ink).

For the sake of example, the relatively high resistance portions 704 may have a resistance of around 4KΩ, and the relatively low resistance portions 706 may have a resistance of around 0.5KΩ, as is represented by the equivalent circuit 708, showing three monitored tracks (monitoring three storage volumes), which may be monitored within a single monitored circuit.

For these three storage volumes, there are 8 combinations of possible states (i.e. pill in or pill removed) with different characteristic resistance values. For the sake of example, a 0 is used to indicate that a storage volume has been accessed (e.g. a pill has been removed) and a 1 indicates that the track is intact and the pill remains in the storage volume:

| Pill state | Total Resistance R [ohms] |
|---|---|
| 000 | Infinite |
| 001 | 7.0K |
| 010 | 6.0K |
| 011 | 4.2K |
| 100 | 5.0K |
| 101 | 3.4K |
| 110 | 3.2K |
| 111 | 2.8K |

As can be seen, if the resistance R can be sufficiently accurately determined, it is possible to know how many of the three storage volumes have been accessed and even to know which of the storage volumes has been accessed with just two couplings. In total, the status of all 12 of the storage volumes of a blister pack 700 arranged as shown in FIG. 7 can be determined with just five couplings (one of which is shared between four network portions, which in effect provide monitored circuits 708). Providing fewer couplings may reduce the complexity of an apparatus and, as several tracks can be queried in one interrogation, energy and/or time to determine the state of a blister pack 700 or the like may be reduced. As in this example, the difference between the resistance values is relatively small, a pack arranged according to the principles illustrated in FIG. 7 may be combined with the methods and principles described above in relation to FIG. 1-6. However, the in other examples, the resistance of the circuit could be determined in some other way, which may not consider the coupling resistance.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagram described above show a specific order of execution, the order of execution may differ from that which is depicted. It shall be understood that flows and/or blocks in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus may execute the machine readable instructions. Thus functional modules of the apparatus and devices (for example, elements within the monitoring apparatus 110, 612) may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. Monitoring circuitry comprising:
   a first contact pad and a second contact pad to electrically connect the monitoring circuitry to a monitored circuit, the monitored circuit having a resistance arranged between a third contact pad and a fourth contact pad, wherein the resistance of the monitored circuit is indicative of a status;
   wherein the first contact pad comprises a first connection element and a second connection element, wherein the first connection element and the second connection element are galvanically separated and are arranged to collectively form an electrical connection with the third contact pad of the monitored circuit; and
   a monitoring apparatus to:
   determine the resistance of the monitored circuit,
      wherein the monitoring apparatus is to:
         determine a coupling resistance by acquiring a resistance between the first connection element and the second connection element via the third contact pad, and
         account for the coupling resistance in determining the resistance of the monitored circuit.

2. The monitoring circuitry claim 1, wherein the first contact pad further comprises a third connection element.

3. The monitoring circuitry of claim 2, wherein the monitoring apparatus is to acquire:
   a first resistance between the first connection element and the second connection element via the third contact pad,
   a second resistance between the second connection element and the third connection element via the third contact pad, and
   a third resistance between the first connection element and the third connection element via the third contact pad.

4. The monitoring circuitry of claim 3, wherein the monitoring apparatus is to use the first, second and third resistances to determine a connection resistance between at least one of the first connection element, second connection element, and third connection element, and the third contact pad of the monitored circuit.

5. The monitoring circuitry of claim 1, wherein the first contact pad and the second contact pad each comprise a first connection element and a second connection element that are galvanically separated from one another, and wherein the connection elements of the first contact pad and the second contact pad are to form an electrical connection respectively with the third contact pad and a fourth contact pad of the monitored circuit.

6. The monitoring circuitry of claim 5, wherein the resistance is one of a plurality of resistances and the plurality of resistances include:
   a first resistance between the first connection element of the first contact pad and second connection element of the first contact pad via the third contact pad;
   a second resistance between the first connection element of the second contact pad and second connection element of the second contact pad via the fourth contact pad;
   a third resistance between the first connection element of the first contact pad and the first connection element of the second contact pad via the monitored circuit; and
   a fourth resistance between the second connection element of the first contact pad and second connection element of the second contact pad via the monitored circuit.

7. The monitoring circuitry of claim 6, wherein the plurality of resistances include:
   a fifth resistance between the first connection element of the first contact pad and the second connection element of the second contact pad via the monitored circuit; and
   a sixth resistance between the second connection element of the first contact pad and the first connection element of the second contact pad via the monitored circuit.

8. The monitoring circuitry of claim 5, comprising:
   a current source to pass a current having a predetermined current value through the monitored circuit via the first connection element of the first contact pad and the first connection element of the second contact pad.

9. The monitoring circuitry of claim 8, comprising:
a voltmeter connected between the second connection element of the first contact pad and the second connection element of the second contact pad,
wherein the monitoring apparatus is to acquire a voltage measured by the voltmeter and to determine a value of the resistance of the monitored circuit based on the predetermined current value and the measured by the voltmeter.

10. The monitoring circuitry of claim 1, wherein a contact pad comprises a region of a substrate printed with conductive ink.

11. A blister pack monitor comprising:
a securing element to secure a blister pack comprising at least one storage volume and at least one monitored track which is interrupted to provide access to an interior of the storage volume;
at least one contact pad which provides an electrical connection with a monitored track of a secured blister pack, wherein the at least one contact pad comprises a first connection element and a second connection element, wherein the first connection element and the second connection element are galvanically separated arranged to collectively form an electrical connection with a common contact pad of the monitored circuit; and
electronic monitoring apparatus to determine a status of the monitored track based on a a coupling resistance between the at least one contact pad and the common contact pad, wherein the coupling resistance is based on a resistance acquired between the first connection element and the second connection element via the common connection pad of the blister pack.

12. The blister pack monitor of claim 11, wherein a contact pad comprises a region of a substrate printed with conductive ink.

13. A method of indicating a status of a monitored circuit comprising:
providing a monitoring circuit comprising a first contact pad and a second contact pad;
providing a monitored circuit having a resistance arranged between a third contact pad and a fourth contact pad, wherein the resistance of the monitored circuit is indicative of the status,
wherein the first contact pad comprises a first connection element and a second connection element, wherein the first connection element and the second connection element are galvanically separated and arranged to collectively form an electrical connection with the third connection pad of the monitored circuit;
wherein a coupling resistance may be determined by based on an acquired a resistance between the first connection element and the second connection element via the third contact pad,
wherein the resistance of the monitored circuit may be determined based on the determined coupling resistance; and
indicating the status of the a monitored circuit based on the determined resistance.

14. The method of claim 13, wherein a contact pad comprises a region of a substrate printed with conductive ink.

* * * * *